United States Patent
Gao et al.

(10) Patent No.: US 11,094,528 B2
(45) Date of Patent: Aug. 17, 2021

(54) SURFACE TREATMENT OF SUBSTRATES USING PASSIVATION LAYERS

(71) Applicants: Beijing E-Town Semiconductor Technology Co., Ltd., Beijing (CN); Mattson Technology, Inc., Fremont, CA (US)

(72) Inventors: Tongchuan Gao, San Jose, CA (US); Grigoriy Kishko, Redwood City, CA (US); Vijay M. Vaniapura, Tracy, CA (US); Michael X. Yang, Palo Alto, CA (US)

(73) Assignees: BEIJING E-TOWN SEMICONDUCTOR TECHNOLOGY CO., LTD., Beijing (CN); MATTSON TECHNOLOGY, INC., Fremont, CA (US)

( * ) Notice: Subject to any disclaimer, the term of this patent is extended or adjusted under 35 U.S.C. 154(b) by 0 days.

(21) Appl. No.: 16/282,909

(22) Filed: Feb. 22, 2019

(65) Prior Publication Data
US 2019/0189420 A1   Jun. 20, 2019

Related U.S. Application Data

(63) Continuation of application No. 15/843,043, filed on Dec. 15, 2017, now Pat. No. 10,217,626.

(51) Int. Cl.
*H01L 21/02* (2006.01)
*H01L 21/56* (2006.01)
(Continued)

(52) U.S. Cl.
CPC ............ *H01L 21/0206* (2013.01); *B08B 5/00* (2013.01); *G03F 7/427* (2013.01);
(Continued)

(58) Field of Classification Search
CPC ............. H01L 21/0234; H01L 21/0239; H01L 21/02318; H01L 21/02359
See application file for complete search history.

(56) References Cited

U.S. PATENT DOCUMENTS 5,571,366 A * 11/1996 Ishii ................... H01J 37/32082
 118/723 I
6,180,533 B1 * 1/2001 Jain ..................... H01L 21/3065
 257/E21.218
(Continued)

OTHER PUBLICATIONS

Chen, "Radio Frequency Plasma Sources for Semiconductor Processing", Advanced Plasma Technology (2007): Chapter 6, pp. 99-105 (Year: 2007).*
(Continued)

*Primary Examiner* — Michele Fan
(74) *Attorney, Agent, or Firm* — Dority & Manning, P.A.

(57) ABSTRACT

Processes and apparatuses for the treatment of semiconductor workpieces are provided. In some embodiments, a method can include placing the workpiece in a processing chamber. The processing chamber can be separated from a plasma chamber by a separation grid assembly. The method can include forming a passivation layer on the workpiece in the processing chamber using radicals generated in a first plasma in the plasma chamber. The method can include performing a surface treatment process on the workpiece in the processing chamber using a second plasma generated in the plasma chamber.

11 Claims, 5 Drawing Sheets

(51) Int. Cl.
 *H01L 23/31*  (2006.01)
 *G03F 7/42*  (2006.01)
 *B08B 5/00*  (2006.01)
 *H01L 29/10*  (2006.01)
 *H01L 29/165*  (2006.01)
 *H01L 29/78*  (2006.01)

(52) U.S. Cl.
 CPC ...... *H01L 21/0217* (2013.01); *H01L 21/0234* (2013.01); *H01L 21/02247* (2013.01); *H01L 21/56* (2013.01); *H01L 23/3171* (2013.01); *H01L 29/1054* (2013.01); *H01L 29/165* (2013.01); *H01L 29/7851* (2013.01)

(56) References Cited

U.S. PATENT DOCUMENTS

| | | | | |
|---|---|---|---|---|
| 6,217,703 | B1* | 4/2001 | Kitagawa | H01J 37/32357 118/715 |
| 6,217,786 | B1* | 4/2001 | Hills | H01L 21/31116 216/79 |
| 6,303,520 | B1 | 10/2001 | Kwong et al. | |
| 6,475,902 | B1* | 11/2002 | Hausmann | C23C 16/34 257/E21.17 |
| 7,288,484 | B1 | 10/2007 | Goto et al. | |
| 2003/0003768 | A1* | 1/2003 | Cho | H01L 21/02216 438/778 |
| 2003/0015294 | A1 | 1/2003 | Wang | |
| 2003/0154921 | A1* | 8/2003 | Matsuki | C23C 16/452 118/715 |
| 2004/0005408 | A1* | 1/2004 | Kiryu | C23C 16/0218 427/248.1 |
| 2004/0084413 | A1* | 5/2004 | Aoi | H01L 21/31116 216/67 |
| 2004/0156987 | A1* | 8/2004 | Yim | C23C 16/56 427/255.6 |
| 2005/0014375 | A1 | 1/2005 | Kim | |
| 2005/0026430 | A1* | 2/2005 | Kim | H01L 21/31116 438/689 |
| 2005/0215005 | A1* | 9/2005 | Allman | H01L 21/3145 438/239 |
| 2006/0094219 | A1* | 5/2006 | Soda | H01L 21/0228 438/597 |
| 2007/0111487 | A1* | 5/2007 | Kim | H01L 27/24 438/478 |
| 2008/0020570 | A1* | 1/2008 | Naik | H01L 21/76834 438/675 |
| 2008/0038673 | A1* | 2/2008 | Nagaiwa | H01L 21/31122 430/313 |
| 2008/0124919 | A1* | 5/2008 | Huang | H01L 21/02063 438/643 |
| 2008/0142988 | A1* | 6/2008 | Hyland | H01L 21/76814 257/774 |
| 2008/0289650 | A1 | 11/2008 | Arena | |
| 2008/0314523 | A1* | 12/2008 | Iizuka | H01J 37/32449 156/345.34 |
| 2009/0277874 | A1* | 11/2009 | Rui | H01J 37/32357 216/67 |
| 2010/0090342 | A1* | 4/2010 | Chang | H01L 21/76846 257/751 |
| 2010/0247805 | A1* | 9/2010 | Kabe | H01L 21/02252 427/575 |
| 2011/0086517 | A1* | 4/2011 | Honda | H01L 21/0217 438/792 |
| 2011/0207273 | A1 | 8/2011 | Jeong | |
| 2011/0236600 | A1 | 9/2011 | Fox | |
| 2012/0003815 | A1 | 1/2012 | Lee | |
| 2012/0073753 | A1* | 3/2012 | Satoh | H01J 37/32009 156/345.33 |
| 2014/0099795 | A1* | 4/2014 | Tobin | H01L 21/31116 438/715 |
| 2014/0109930 | A1 | 4/2014 | Kaurfman-Osborn | |
| 2014/0170853 | A1* | 6/2014 | Shamma | H01L 21/02115 438/699 |
| 2014/0302678 | A1* | 10/2014 | Paterson | H01J 37/321 438/700 |
| 2015/0040822 | A1* | 2/2015 | Olsen | C30B 25/186 117/97 |
| 2015/0194340 | A1* | 7/2015 | Hagiwara | G03F 9/7026 438/14 |
| 2016/0086772 | A1* | 3/2016 | Khaja | H01J 37/321 315/111.21 |
| 2016/0181117 | A1* | 6/2016 | Arghavani | H01L 21/31116 438/712 |
| 2016/0362302 | A1* | 12/2016 | Jang | C01B 33/029 |
| 2017/0107345 | A1* | 4/2017 | Kon | C08J 7/0427 |
| 2017/0229314 | A1* | 8/2017 | Tan | H01L 21/30655 |
| 2017/0278973 | A1* | 9/2017 | Ando | H01L 27/127 |
| 2017/0301746 | A1* | 10/2017 | Edelstein | H01L 21/02337 |
| 2017/0309603 | A1* | 10/2017 | Chen | H01L 25/50 |
| 2017/0316935 | A1* | 11/2017 | Tan | H01J 37/3244 |
| 2017/0345625 | A1* | 11/2017 | Lim | H01J 37/32091 |

OTHER PUBLICATIONS

Zheng et al., "Etching by atomic hydrogen of Ge overlayers on Si(100)," *Journal of Applied Physics*, vol. 90, No. 7, Oct. 1, 2001, pp. 3614-3622.

Cubaynes et al. "Plasma Nitridation Optimization for Sub-15 Å Gate Dielectrics," *The Electrochemical Society, Inc.*, 2003—10 pages.

* cited by examiner

SURFACE TREATMENT OF SUBSTRATES USING PASSIVATION LAYERS

PRIORITY CLAIM

The present application is a continuation of U.S. application Ser. No. 15/843,043, titled "Surface Treatment Of Substrates Using Passivation Layers," having a filing date of Dec. 15, 2017. Applicant claims priority to and the benefit of each of such applications and incorporate all such applications herein by reference in its entirety.

FIELD

The present disclosure relates generally to surface treatment of a substrate using a plasma processing apparatus.

BACKGROUND

Post-implantation photoresist, post-etch residue, and alternative mask removal have been accomplished using plasma dry strip processes. In plasma dry strip, neutral particles from a plasma generated in a remote plasma chamber pass through a separation grid into a processing chamber to treat a substrate, such as a semiconductor wafer.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The method can include placing the workpiece in a processing chamber. The processing chamber can be separated from a plasma chamber by a separation grid assembly. The method can include forming a passivation layer on the workpiece in the processing chamber using radicals generated in a first plasma in the plasma chamber. The method can include performing a surface treatment process on the workpiece in the processing chamber using a second plasma generated in the plasma chamber.

Other example aspects of the present disclosure are directed to systems, methods, and apparatuses for surface treatment of workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
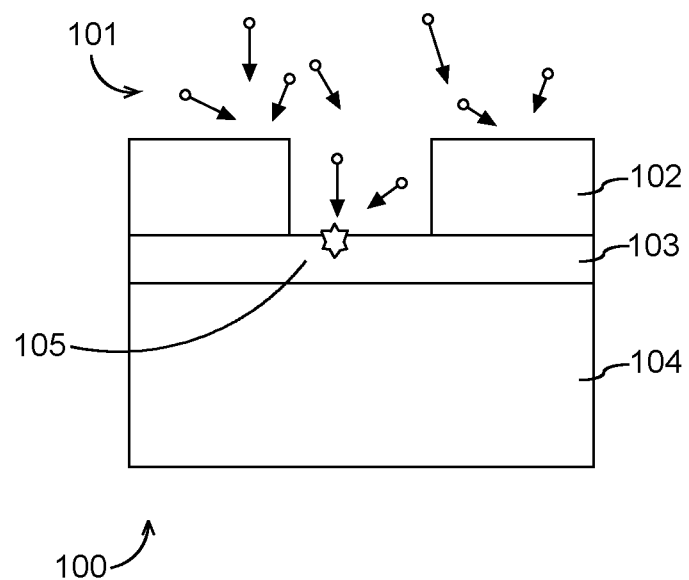
FIG. 1 depicts example semiconductor workpiece damage that can occur in a surface treatment process.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to surface treatment processes and apparatuses for workpieces, such as semiconductor substrates. More specifically, in some embodiments, example aspects of the present disclosure are directed toward workpiece surface treatment processes, such as post-implantation photoresist removal, post-etch residue removal, and other mask removal processes. In some embodiments, a passivation layer can be formed on a workpiece, such as a semiconductor workpiece (e.g., a semiconductor wafers). After formation of the passivation layer, photoresist strip and/or residue removal can be performed with reduced material damage.

More particularly, in some embodiments, a passivation layer can be formed on one or more portions of a workpiece, such as a thin film silicon-germanium SiGe layer. Surface treatment processes can then be performed on the workpiece with reduced surface damage as the passivation layer protects the semiconductor surface. In this way, silicon (Si) and/or SiGe loss can be mitigated independent of processing time.

Example aspects of the present disclosure are discussed with reference to treating a semiconductor wafer for purposes of illustration and discussion. Those of ordinary skill in the art, using the disclosures provided herein, will understand that aspects of the present disclosure can be used in conjunction with the processing of other workpieces without deviating from the scope of the present disclosure. As used herein, the use of the term "about" in conjunction with a numerical value can refer to within 20% of the stated numerical value.

Dry strip and plasma strip are widely used for the removal of photoresists, residues, and other mask materials patterned on wafer surfaces in the modern integrated circuit (IC) manufacturing industry. These methods may employ reactive radicals from a plasma generated using a mixture of various gasses in a remote plasma chamber. The reactive radicals and other gasses can react with the photoresists, residues, and other masking materials to form volatile compounds which can be removed from the process chamber. During the stripping process, several requirements may need to be satisfied including, for instance a high photoresist strip rate, a high material-etch selectivity of the material being removed relative to the underlying material, the prevention of oxidation of the underlying materials, and critical dimension (CD) control.

Fin field-effect transistor (FinFET) technology has been widely adopted by the 22 nm node and has become compelling for 14 nm node and beyond logic devices with silicon (Si) and SiGe strained channels. During a dry strip process, the reactive radicals attack Si/SiGe as well as the photoresist and cause Si/SiGe damage and/or Si/SiGe film loss. The damaged Si/SiGe area can be prone to oxidation in the following fabrication steps. Si/SiGe loss results in thinner Si/SiGe channels and can deteriorate device performance. Therefore, reducing the Si/SiGe film loss during the dry strip process is critical for preserving FinFET performance. In some cases, less than one Angstrom of Si/SiGe loss will be required for each dry strip process.

In one example embodiment, a method for processing a workpiece includes: placing the workpiece in a processing chamber, the processing chamber being separated from a plasma chamber by a separation grid assembly; forming a passivation layer on the workpiece in the processing chamber using radicals generated in a first plasma in the plasma chamber; and performing a surface treatment process on the workpiece in the processing chamber using a second plasma generated in the plasma chamber.

In some embodiments, the workpiece is a semiconductor wafer having a SiGe layer. The passivation layer can be formed on the SiGe layer.

In some embodiments, forming the passivation layer on the workpiece includes: generating the first plasma with a $N_2$ case and an inert gas in the plasma chamber; making the plasma pass through the separation grid assembly to eliminate all plasma species but radicals; and exposing a surface of the workpiece to radicals generated in the first plasma; and passing through the separation grid assembly to form the passivation layer. In some embodiments, the inert gas is an Ar gas.

In some embodiments, a flow rate of the Ar gas is less than about 20% of a flow rate of the $N_2$ gas in the plasma chamber during generating of the first plasma.

In some embodiments, a pressure in the process chamber during forming of the passivation layer is in the range of about 600 mT to about 1200 mT.

In some embodiments, an RF source is energized with power in the range of about 2000 W to about 5000 W to generate the first plasma in the plasma chamber.

In some embodiments, a temperature of the workpiece is maintained in a range of about 300° C. to about 400° C. during forming of the passivation layer.

In some embodiments, exposing a surface of the workpiece to radicals generated in the first plasma forms —N or —NH bonds on the workpiece.

In some embodiments, the surface treatment process comprises a dry strip process. In one example embodiment, the dry strip process comprises: generating the second plasma with a hydrogen gas in the plasma chamber; and exposing a surface of the workpiece to radicals generated in the second plasma to conduct the dry strip process.

In some embodiments, the second plasma is generated using a H2 gas and a N2 gas. In some embodiments, a ratio of the H2 gas to the N2 gas is in the range of about 0.2 to about 0.5.

In another example embodiment, forming the passivation layer on the workpiece includes placing a workpiece on a substrate holder in a processing chamber, the workpiece comprising a SiGe layer; performing a passivation process with a first gas mixture in a plasma chamber to form a passivation layer on the workpiece; and subsequent to performing the passivation process, performing a dry strip process with a second gas mixture in the plasma chamber to remove one or more materials from a surface of the workpiece; wherein the plasma processing apparatus comprises the processing chamber separated from the plasma chamber by a separation grid assembly, the plasma processing apparatus comprising an inductively coupled plasma source operable to generate a plasma in the plasma chamber.

In some embodiments, the first gas mixture comprises a $N_2$ gas and an inert gas. In some embodiments, the inert gas comprises Ar gas. In some embodiments, a flow rate of the Ar gas is less than about 20% of a flow rate of the $N_2$ gas in the plasma chamber during generating of the first plasma.

In some embodiments, the second gas mixture comprises a $H_2$ gas and an $N_2$ gas. In some embodiments, a ratio of the $H_2$ gas to the $N_2$ gas is in the range of about 0.2 to about 0.5.

With reference now to the FIGS., example embodiments of the present disclosure will now be set forth. FIG. 1 illustrates semiconductor workpiece damage that can occur in dry strip surface processes. The generation of plasma is often used to form reactive radicals 101 that remove photoresists (and other surface residues) 102 and clean the semiconductor thin film 103, which resides on the surface of the semiconductor substrate 104. The semiconductor thin film 103 can be a silicon (Si) thin film or a silicon-germanium (SiGe) thin film and the semiconductor substrate 104 can be a silicon (Si) substrate. Other gasses such as hydrogen fluoride can also be used to clean the surface of the semiconductor workpiece 100.

However, in addition to removing the photoresist 102 and other substances from the semiconductor thin film 103, radicals 101 and other gasses can also attack the thin film 103. The damage can be especially pronounced in areas of the thin film 103 that are exposed and free of photoresist 102, which can be referred to as thin film damage areas 105. Embodiments of the present disclosure can protect the thin film damage areas 105 by forming a passivation layer over the exposed areas of the semiconductor thin film 103.

Figure 2:
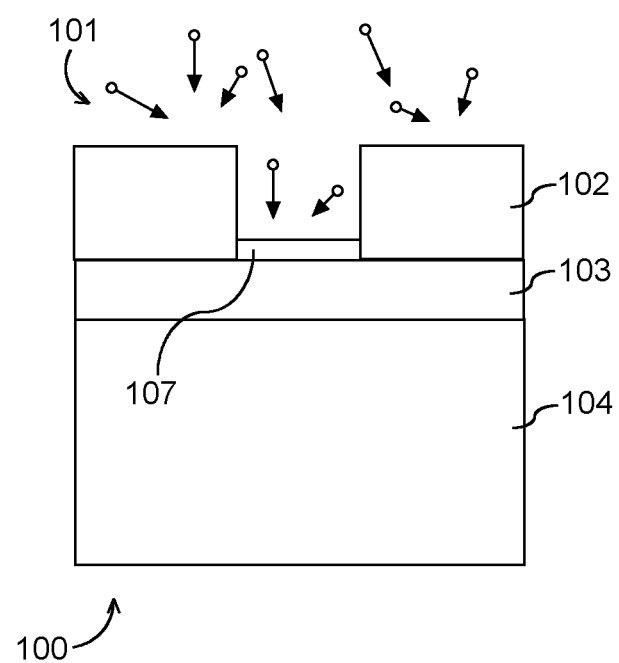
FIG. 2 illustrates an example passivation layer on a workpiece according to example embodiments of the present disclosure.

More particularly, FIG. 2 depicts an example workpiece 100 with a passivation layer 107 formed according to example aspects of the present disclosure. As shown, the passivation layer 107 can protect thin film 103 from damage from radicals 101 during a plasma strip process or other surface treatment process. With the passivation layer 107 applied, surface treatment processes including plasma treatment can be performed and damage to the semiconductor thin film 103 can be reduced or eliminated.

Figure 3:
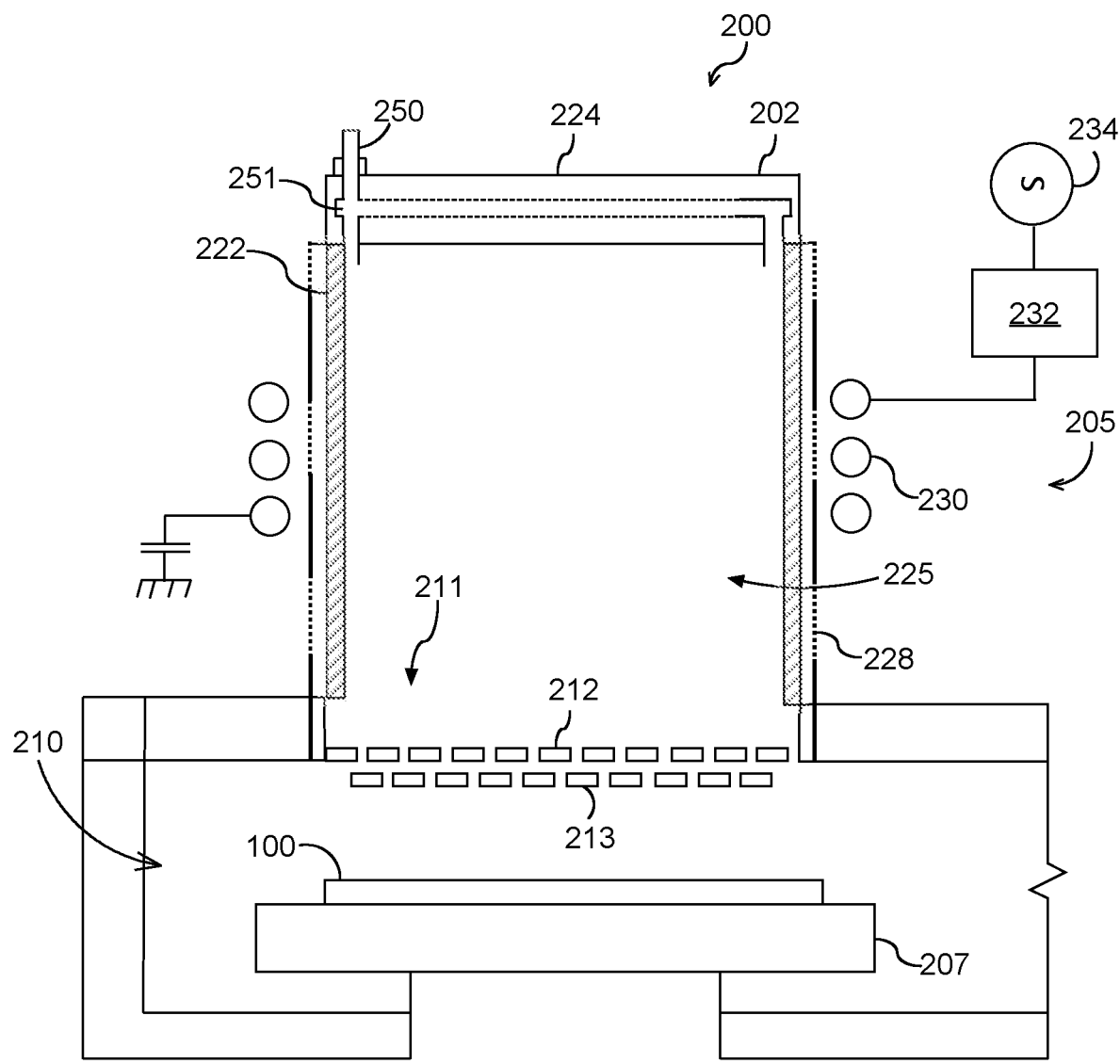
FIG. 3 depicts a semiconductor workpiece surface treatment apparatus according to example embodiments of the present disclosure.

FIG. 3 depicts an example semiconductor workpiece surface treatment apparatus 200 that can be used to perform surface treatment processes according to example embodiments of the present disclosure. As illustrated, the semiconductor workpiece surface treatment apparatus 200 includes a processing chamber 210 and a plasma chamber 202 that is separate from the processing chamber 210. The processing chamber 210 includes a substrate holder or pedestal 207 operable to hold a workpiece 100 to be processed, such as a semiconductor wafer. In this example illustration, a plasma is generated in plasma chamber 202 (i.e., plasma generation region) by an inductively coupled plasma source 205 and desired species are channeled from the plasma chamber 202 to the surface of substrate 100 through a separation grid assembly 211.

The plasma chamber 202 includes a dielectric side wall 222 and a ceiling 224. The dielectric side wall 222, ceiling 224, and separation grid assembly 211 define a plasma chamber interior 225. The dielectric side wall 222 can be formed from any dielectric material, such as quartz and/or alumina. The inductively coupled plasma source 205 can include an induction coil 230 disposed adjacent the dielectric side wall 222 about the plasma chamber 202. The induction coil 230 is coupled to an RF power generator 234 through a suitable matching network 232. Reactant and carrier gases can be provided to the chamber interior from a gas supply 250 and annular gas distribution channel 251 or other suitable gas introduction mechanism. When the induction coil 230 is energized with RF power from the RF power generator 234, a plasma can be generated in the plasma chamber 202. In a particular embodiment, the semiconductor workpiece surface treatment apparatus 200 can include an optional Faraday shield 228 to reduce capacitive coupling of the induction coil 230 to the plasma. The Faraday shield 228 can protect the plasma chamber 202 from being sputtered by the energized species in the plasma, which is especially critical when hydrogen based chemistry is used with a quartz tube plasma chamber.

As shown in FIG. 3, the separation grid assembly 211 separates the plasma chamber 202 from the processing chamber 210. The separation grid assembly 211 can be used to perform ion filtering from a mixture generated by plasma in the plasma chamber 202 to allow the passage of neutral radicals through the separation grid. The neutral radicals can be exposed to the workpiece 100 in the processing chamber 210.

The separation grid assembly 211 can be a multi-plate separation grid. For instance, the separation grid assembly 211 can include a first grid plate 212 and a second grid plate 213 that are spaced apart in parallel relationship to one another. The first grid plate 212 and the second grid plate 213 can be separated by a distance.

The first grid plate 212 can have a first grid pattern having a plurality of holes. The second grid plate 213 can have a second grid pattern having a plurality of holes. The first grid pattern can be the same as or different from the second grid pattern. Charged particles can recombine on the walls in their path through the holes of each grid plate 212, 213 in the variable pattern separation grid 211. Neutral species can flow relatively freely through the holes in the first grid plate 212 and the second grid plate 213. The size of the holes and thickness of each grid plate 212 and 213 can affect transparency for both charged and neutral particles.

In some embodiments, the first grid plate 212 can be made of metal (e.g., aluminum) or other electrically conductive material and/or the second grid plate 213 can be made from either an electrically conductive material or dielectric material (e.g., quartz, ceramic, etc.). In some embodiments, the first grid plate 212 and/or the second grid plate 213 can be made of other materials, such as silicon or silicon carbide. In the event a grid plate is made of metal or other electrically conductive material, the grid plate can be grounded.

Figure 4:
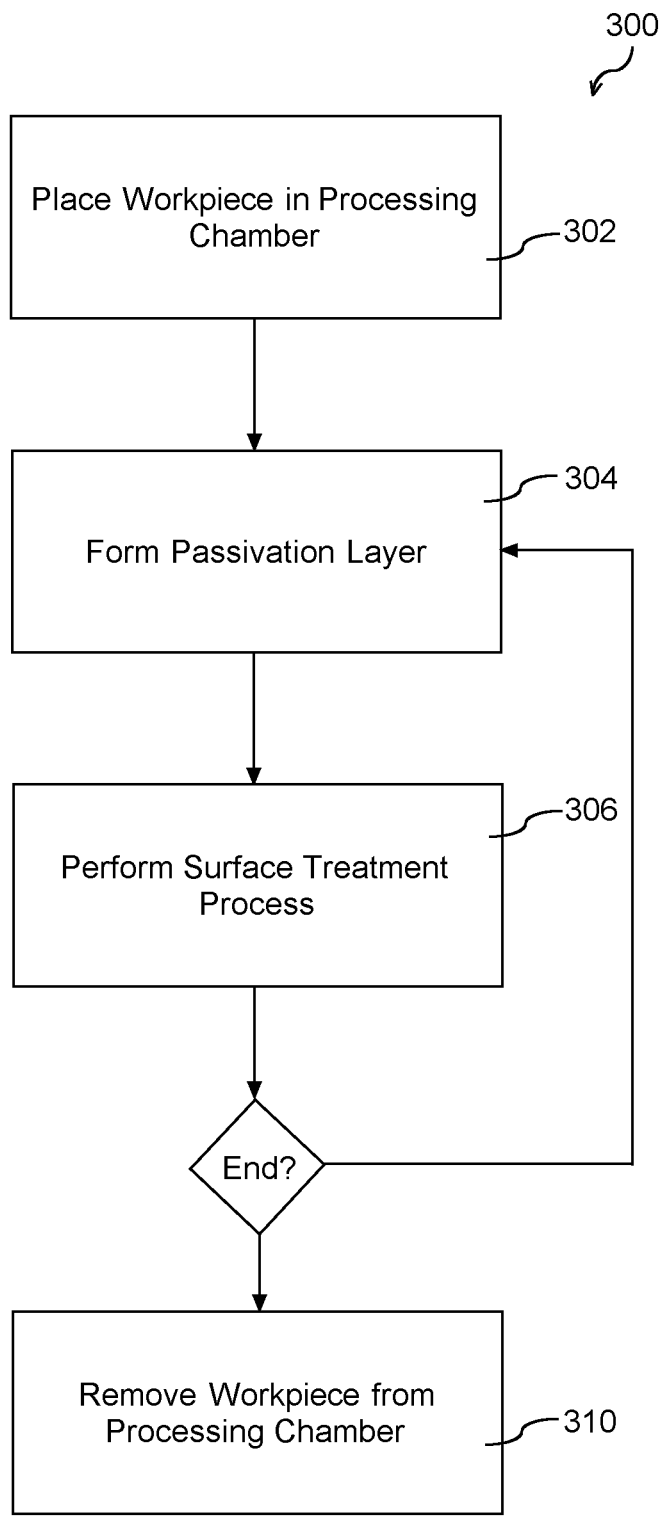
FIG. 4 depicts a flow diagram of an example method for processing a workpiece according to example embodiments of the present disclosure.

FIG. 4 depicts a flow diagram of an example method (300) for treating a workpiece according to example embodiments of the present disclosure. The method (300) can be performed using the semiconductor workpiece surface treatment apparatus 200 of FIG. 2. FIG. 3 depicts steps performed in a particular order for purposes of illustration and discussion. Those of ordinary skill in the art, using the disclosures provided herein, will understand that various steps of any of the methods discussed herein can be adapted, expanded, omitted, rearranged, performed simultaneously, and/or modified in various ways without deviating from the scope of the present disclosure.

At (302), the method includes placing a workpiece in a process chamber. The processing chamber can be separate from a plasma chamber (e.g., separated by a separation grid assembly). For instance, the method can include placing a workpiece 100 onto pedestal 207 in the processing chamber 210 of the apparatus 200 of FIG. 3. In some embodiments, the workpiece can include a SiGe thin film layer.

At (304), the method includes forming a passivation layer on the workpiece. The passivation layer can be used to protect a thin film layer (e.g., SiGe thin film layer) during, for instance, a strip process using the surface treatment apparatus 200. In example embodiments, generating the passivation layer can be accomplished by generating a first plasma using a first gas mixture in the plasma chamber. Radicals from the plasma can pass through the separation grid assembly and be used to form a passivation layer on the workpiece, such as on a SiGe layer.

In some embodiments, the first gas mixture can include $N_2$ and an inert gas, such as Ar gas. A flow rate of the inert gas relative to the flow rate of the $N_2$ gas in the plasma chamber during generation of the first plasma can be less than about 20%.

Radicals generated in the first plasma and passing through the separation grid can be used to form —N and/or —NH bonds on the workpiece. The —N and/or —NH bonds can be used for terminating terminal dangling bonds on a thin film layer, such as SiGe. The —N and/or —NH groups are highly resistive to normal stripping processes, ambient oxidation, hydrogen fluoride and other surface treatment processes. The passivation steps promote the robustness of the dry strip processes and can simplify process integration.

Example process parameters for forming a passivation layer using a plasma generated in the plasma chamber are below:

Ar dilution in $N_2$: less than 20% of the total flow
Process Pressure: 600 to 1200 mT
Source Power: 2000 W to 5000 W
Temperature: 300 to 400° C.

Subsequent to forming the passivation layer, the method can include performing a surface treatment process (e.g., a dry strip process) on the workpiece in the processing chamber using a second plasma generated in a second gas mixture in the plasma chamber (306). Various surface treatment processes can be performed after the passivation layer is formed. During the surface treatment processes, the passivation layer serves as a shield for protecting the portions of the workpiece.

The surface treatment process can include removing a photoresist, removing residues (such as post-etch residues), or cleaning the workpiece. The surface treatment process can include exposing the workpiece to hydrogen and nitrogen gasses having a ratio ($H_2/N_2$) of from about 0.20 to about 0.50. The surface treatment process can exclude inert gasses (e.g., argon and/or helium), or can have only trace amounts of inert gasses used to tune the process. Hydrogen fluoride can also be used as part of the surface treatment process and the surface treatment process can be performed at a temperature of greater than 300° C.

For example, the surface treatment process may involve reducing chemistries such as $N_2/H_2$, $N_2/H_2/Ar$, $Ar/H_2$ and $He/H_2$. The surface treatment process can include a dry strip and/or a plasma strip to remove photoresists and other residues. The gases can be delivered to the plasma chamber 202, and the plasma source 205 can induce a plasma in the plasma chamber 202. Radicals generated in the plasma can then flow downstream through separation grid 211. The grid 211 can keep ions from entering the process chamber 210 such that a stream of neutral radicals can be applied to the workpiece. Using reducing chemistries, the photoresist stripping process can include hydrogen and a weak oxidizing agent (e.g. nitrogen). Oxygen gas and/or oxygen plasma can also be included in the surface treatment process. Increasing the temperature (e.g., above 300° C.) can reduce the silicon and germanium etch rate in $H_2$ containing plasmas by promoting the decomposition of intermediate etch product $SiH_2$ and $GeH_2$.

Example process parameters for conducting a surface treatment process using a plasma generated in the plasma chamber are below:

Ar dilution in $N_2$: less than 20% of the total flow
Process Pressure: 600 to 1200 mT
Source Power: 2000 W to 5000 W
Temperature: 300 to 400° C.

At (308), the method can include determining whether to repeat (304) and (306) to further process the workpiece. For instance, the method can repeat formation of the passivation layer (304) and/or performing the surface treatment process (306) until the workpiece is ready for further processing, for instance, in a semiconductor wafer fabrication process.

At (310), the method can include removing the workpiece from the processing chamber. For instance, the workpiece 100 can be removed from the processing chamber 210 of the apparatus 200 in FIG. 3. The apparatus 200 can then be conditioned for processing of future workpieces.

In some embodiments, forming a passivation layer (e.g., (304) of FIG. 3) and/or performing a surface treatment process (e.g., (306) of FIG. 3) can be performed with post-plasma gas injection. Post-plasma gas injection can allow for the injection of a cold gases into the radicals passing through the separation grid. The cold gas can reduce the radical temperature, thus tuning the energy distribution of the radicals passing through the separation grid. The injected cold gas can be used to improve process uniformity and reduce loss rate (e.g., SiGe loss rate).

Figure 5:
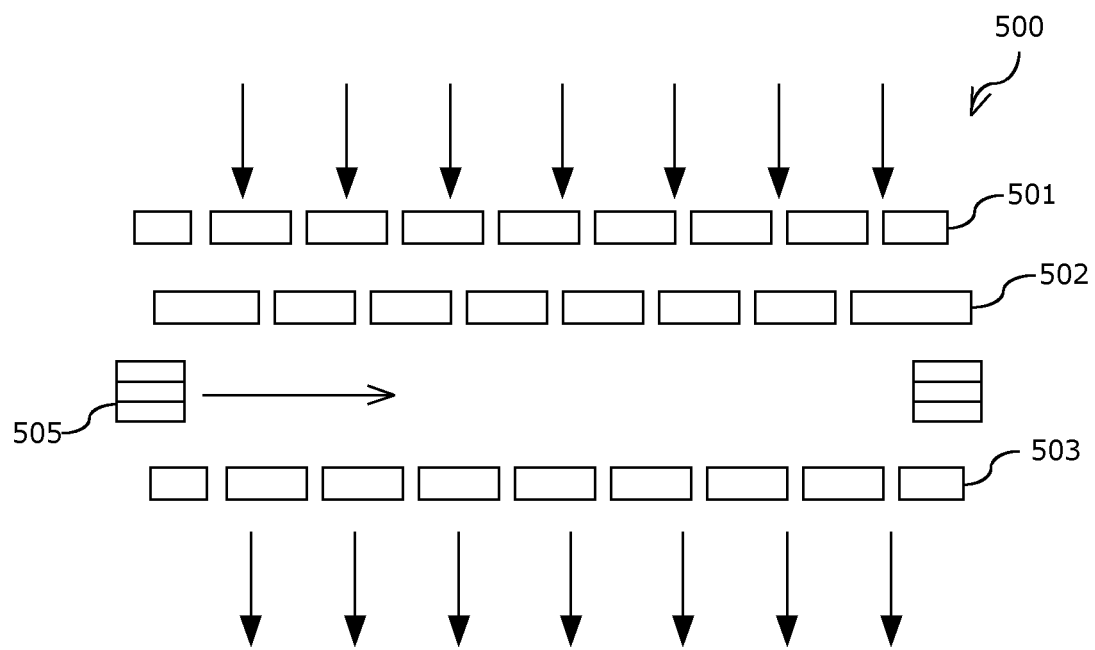
FIG. 5 depicts example post plasma injection according to example embodiments of the present disclosure.

FIG. 5 depicts an example separation grid assembly 500 that can be used for post-plasma gas injection according to example embodiments of the present disclosure. The separation grid assembly 500 is a multi-plate separation grid. The multi-plate separation grid 500 can include a first grid plate 501 and a second grid plate 502 disposed in a parallel relationship for UV/ion filtering. A third grid plate 503 can also be included and having a parallel relationship to the first and second separation grids. The grid plates 501, 502, 503 can be staggered such that there is no clear line of sight between the plasma chamber 202 and the process chamber 210. Therefore, the staggered configuration allows for the multi-plate separation grid 500 to block electromagnetic waves (such as those created by the plasma source 205 in the plasma chamber 202) from entering the process chamber 210 and causing damage to the workpiece 100.

Each of the separation grid plates 501, 502, 503 can be made from different materials or the same material. For example, the grid plates 501, 502, 503 of can be made of metal (e.g., aluminum), another electrically conductive material, or a dielectric material (e.g., quartz, ceramic, etc.). The separation grid plates 501, 502, 503 can also be made of silicon or silicon carbide. In the event a grid plate is made of metal or other electrically conductive material, the grid plate can be grounded.

The first grid plate 501 can have a first grid pattern having a plurality of holes. The second grid plate 502 can have a second grid pattern having a plurality of holes. The first grid pattern 501 can be the same as or different from the second grid pattern 502. Charged particles (e.g., ions) can recombine on the walls on their path through the holes of each grid plate 501, 502, 503 in the separation grid 500. Neutral species (e.g., radicals) can flow relatively freely through the holes in the first, second, and third grid plates 501, 502, 503.

A grid gas line 505 can be configured to admit various gasses into the separation grid 500. The gasses from the grid gas line 505 can be at a lower temperature than those coming from the plasma chamber 202. FIG. 5 shows the grid gas line 505 admitting gasses between the second and third grid plates 502, 503. However, more grid plates can be included and the grid gas line 505 can be configured to administer gas in or between any of the grid plates. Two or more gas lines 505 can also be included to administer gas at two more levels within the multi-plate separation grid 500.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece in a plasma processing apparatus, the plasma processing apparatus comprising a processing chamber separated from a plasma chamber by a separation grid assembly, the plasma processing apparatus comprising an inductively coupled plasma source operable to generate a plasma in the plasma chamber, the method comprising:
   placing a workpiece on a substrate holder in the processing chamber, the workpiece comprising a semiconductor layer;
   performing a passivation process with a first gas mixture in the plasma chamber to form a passivation layer on the workpiece; and
   subsequent to performing the passivation process, performing a dry strip process with a second gas mixture in the plasma chamber to remove one or more materials from a surface of the workpiece with the passivation layer, wherein the passivation layer remains on the workpiece during the dry strip process;
   wherein the dry strip process comprises injecting a cooling gas between a first grid plate and a second grid plate of the separation grid assembly into particles of the second gas mixture passing through the separation grid assembly;
   wherein the first gas mixture comprises an inert gas and an N2 gas, wherein a flow rate of the inert gas relative to a flow rate of the N2 gas in the plasma chamber during the passivation process is less than about 20%;
   wherein the second gas mixture comprises an H2 gas and an N2 gas.

2. The method of claim 1, wherein the semiconductor layer comprises a SiGe layer.

3. The method of claim 2, wherein the passivation layer is formed on the SiGe layer.

4. The method of claim 1, wherein the passivation process comprises:
   generating a first plasma with the first gas mixture in the plasma chamber;
   passing radicals generated in the first plasma through the separation grid assembly; and
   exposing a surface of the workpiece to radicals generated in the first plasma and passing through the separation grid assembly to form the passivation layer.

5. The method of claim 4, wherein an RF source is energized with power in the range of about 2000 W to about 5000 W to generate the first plasma in the plasma chamber.

6. The method of claim 4, wherein exposing a surface of the workpiece to radicals generated in the first plasma forms N or NH bonds on the workpiece.

7. The method of claim 1 wherein the inert gas comprises an Ar gas.

8. The method of claim 1, wherein a pressure in the process chamber during passivation process is in the range of about 600 mT to about 1200 mT.

9. The method of claim 1, wherein a temperature of the workpiece is maintained in a range of about 300° C. to about 400° C. during the passivation process.

10. The method of claim 1, wherein the dry strip process comprises:
   generating a second plasma in the second gas mixture in the plasma chamber;
   passing radicals generated in the second plasma through the separation grid assembly; and
   exposing a surface of the workpiece to radicals generated in the second plasma to conduct the dry strip process.

11. The method of claim 1, wherein a ratio of the H2 gas to the N2 gas in the second gas mixture is in the range of about 0.2 to about 0.5.

\* \* \* \* \*